United States Patent
Niska et al.

(10) Patent No.: US 7,282,811 B2
(45) Date of Patent: Oct. 16, 2007

(54) DETECTION OF SHORT CIRCUITS IN A VEHICLE

(75) Inventors: Mats Niska, Hisings Backa (SE); Lennart Nygren, Hindas (SE)

(73) Assignee: Volvo Lastvagnar AB, Gothenburg (SE)

( * ) Notice: Subject to any disclaimer, the term of this patent is extended or adjusted under 35 U.S.C. 154(b) by 0 days.

(21) Appl. No.: 11/308,136

(22) Filed: Mar. 8, 2006

(65) Prior Publication Data

US 2006/0193097 A1 Aug. 31, 2006

Related U.S. Application Data

(63) Continuation of application No. PCT/SE2004/001195, filed on Aug. 16, 2004.

(30) Foreign Application Priority Data

Sep. 18, 2003 (SE) .................... 0302512

(51) Int. Cl.
*H02H 7/18* (2006.01)
(52) U.S. Cl. .................. 307/10.7; 324/522; 702/58; 702/64; 702/185; 340/636.15
(58) Field of Classification Search ............... 307/10.7; 324/522; 702/58, 64, 177, 183, 185; 340/636.15, 340/660, 438, 636.1; 320/133
See application file for complete search history.

(56) References Cited

U.S. PATENT DOCUMENTS

| 4,665,370 | A | * | 5/1987 | Holland ..................... 324/429 |
| 5,962,934 | A | | 10/1999 | Fendt et al. |
| 6,046,511 | A | | 4/2000 | Kincaid |
| 6,456,085 | B1 | * | 9/2002 | Dietl et al. .................. 324/509 |
| 2003/0042909 | A1 | | 3/2003 | Yamamoto et al. |
| 2003/0178970 | A1 | | 9/2003 | Minamiura et al. |
| 2005/0102005 | A1 | * | 5/2005 | Krig et al. .................... 607/29 |

* cited by examiner

*Primary Examiner*—Michael Sherry
*Assistant Examiner*—Daniel Cavallari
(74) *Attorney, Agent, or Firm*—WRB-IP LLP

(57) ABSTRACT

The invention relates to a method and an arrangement for the detection of shorts circuits in the electrical system in a vehicle provided with a battery comprising—measuring and storing the value of the battery voltage at a first moment in time,—measuring the value of the battery voltage at a second moment in time,—comparing the values of the battery voltage at the first and second moments in time,—checking, if the battery voltages at the two moments in time differ from each other by more than a predetermined value, whether one or several of certain predefined systems in the vehicle have been engaged during the interval of time between the first and the second moments in time, with a short circuit being assumed to have taken place if none of the systems in the vehicle have been engaged during the interval of time.

4 Claims, 3 Drawing Sheets

DETECTION OF SHORT CIRCUITS IN A VEHICLE

The present invention is a continuation of International Application No. PCT/SE2004/001195, filed Aug. 16, 2004, which claims priority to SE 0302512-9, filed Sep. 18, 2003, both of which are incorporated by reference.

BACKGROUND AND SUMMARY

The present invention relates to a method and an arrangement for detection of short circuits in a vehicle. By means of the invention, short circuits in a vehicle can be detected in a simple and reliable way and can accordingly be remedied.

In modern vehicles, such as, for example, trucks, buses and construction vehicles, there is a very large amount of electrical cabling. Due to, for example, incorrect laying of cables and movements of the vehicle, the cables' insulation can be damaged, whereby short circuits can arise. These short circuits can be of short duration and intermittent, which means that the fuses in the vehicle are not able to react, which can be very trying and irritating for the driver of the vehicle. In addition, various electrical systems in the vehicle can be disturbed by a short circuit of short duration, with an error function as a result. For example, a processor in a control unit can restart when the supply voltage drops below a certain level.

To be able to detect short circuits in a vehicle reliably at an early stage is therefore an important function in a vehicle.

Document JP 11055848 describes an arrangement that is intended to detect short circuits in the electrical system in a car. A disadvantage of this arrangement is that it can only detect short circuits on the specific cable to which it is connected.

It is desirable to produce an arrangement and a method for being able to detect short circuits that are of short duration and/or intermittent in the electrical system in a vehicle, suitably a truck, at an early stage in a quick and reliable way.

In accordance with an aspect of the present invention, a method is provided for detection of short circuits in the electrical system in a vehicle provided with a battery. The method comprises measurement and storage of the value of the battery voltage at a first moment in time, measurement of the value of the battery voltage at a second moment in time, and comparison of the values of the battery voltage at the first and second moments in time.

If the battery voltages at the two moments in time differ from each other by more than a predetermined value, it is checked whether one or several of certain predefined systems in the vehicle have been engaged during the interval of time between the first and the second moments in time, with a short circuit being assumed to have occurred if none of the systems in the vehicle have been engaged during the interval of time.

In a further aspect of the invention, an arrangement for carrying out the method steps as described above is provided.

The method is suitably carried out continually while the vehicle is operation, and in the same way, an arrangement according to the invention can be running and carrying out measurements and comparisons continually while the vehicle is in operation.

BRIEF DESCRIPTION OF THE DRAWINGS

The invention will be described in greater detail in the following, with reference to the attached drawings, in which.

DETAILED DESCRIPTION

Figure 1:
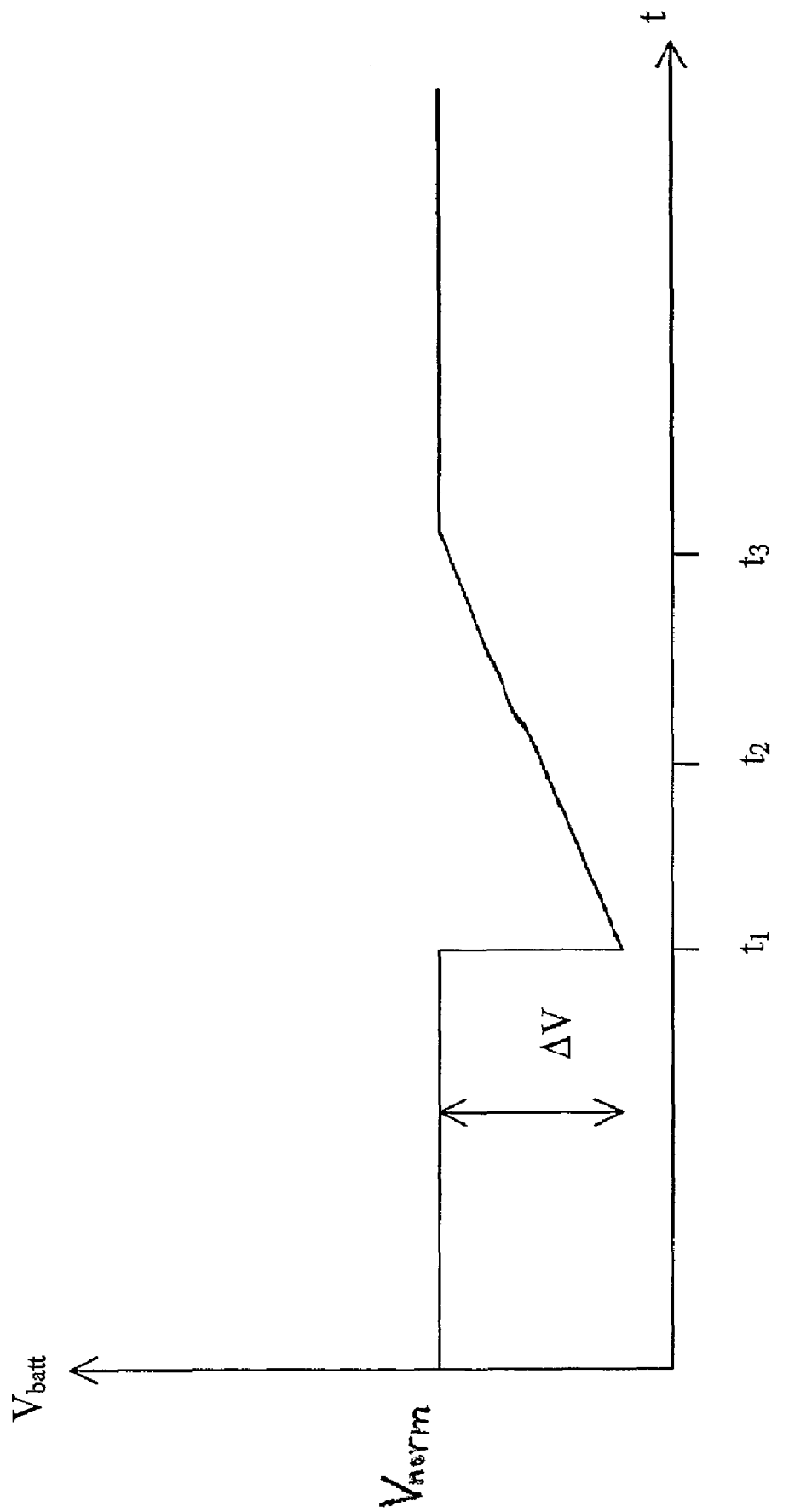
FIG. 1 shows the voltage level in a vehicle during a short circuit of short duration.

FIG. 1 shows schematically the battery voltage level in a vehicle during a temporary short circuit in the electrical system in the vehicle. At the moment in time t1 when the short circuit occurs, the battery voltage drops from a normal level Vnorm to a lower level V1, with the difference between the two levels being represented by ?V. After a little while, the short circuit has ceased, which means that at the moment in time t3 the battery voltage returns to the normal level Vnorm. The fact that the battery voltage returns to its normal value can also be due to the vehicle's generator managing to compensate for the drop in voltage ?V during a short circuit of longer duration.

According to the invention, this temporary drop in battery voltage during a short circuit of short duration is used to detect short circuits that are of such a short duration that the vehicle's fuses and/or other systems in the vehicle are not able to react to them.

The fact the battery voltage in the vehicle drops for a brief interval of time can also be due to other causes that must be taken into consideration so that incorrect detections of short circuits do not occur. The most probable alternative reason for a drop in battery voltage similar to one that is caused by a temporary short circuit is that a consumer of electricity, in other words a subsystem in the vehicle, has been engaged. Examples of such subsystems are air-conditioning systems, climate-control systems, lighting, audio, etc.

In the event of the engaging of a subsystem that consumes energy, the battery voltage will drop momentarily, after which the vehicle's generator cuts in and returns the battery voltage to its normal level, Vnorm. This sequence is very similar to the one that occurs during a short circuit of short duration. It will be described in greater detail, below in this description, how it is possible, according to the invention, to distinguish between these two different causes of a drop in voltage.

Figure 2:
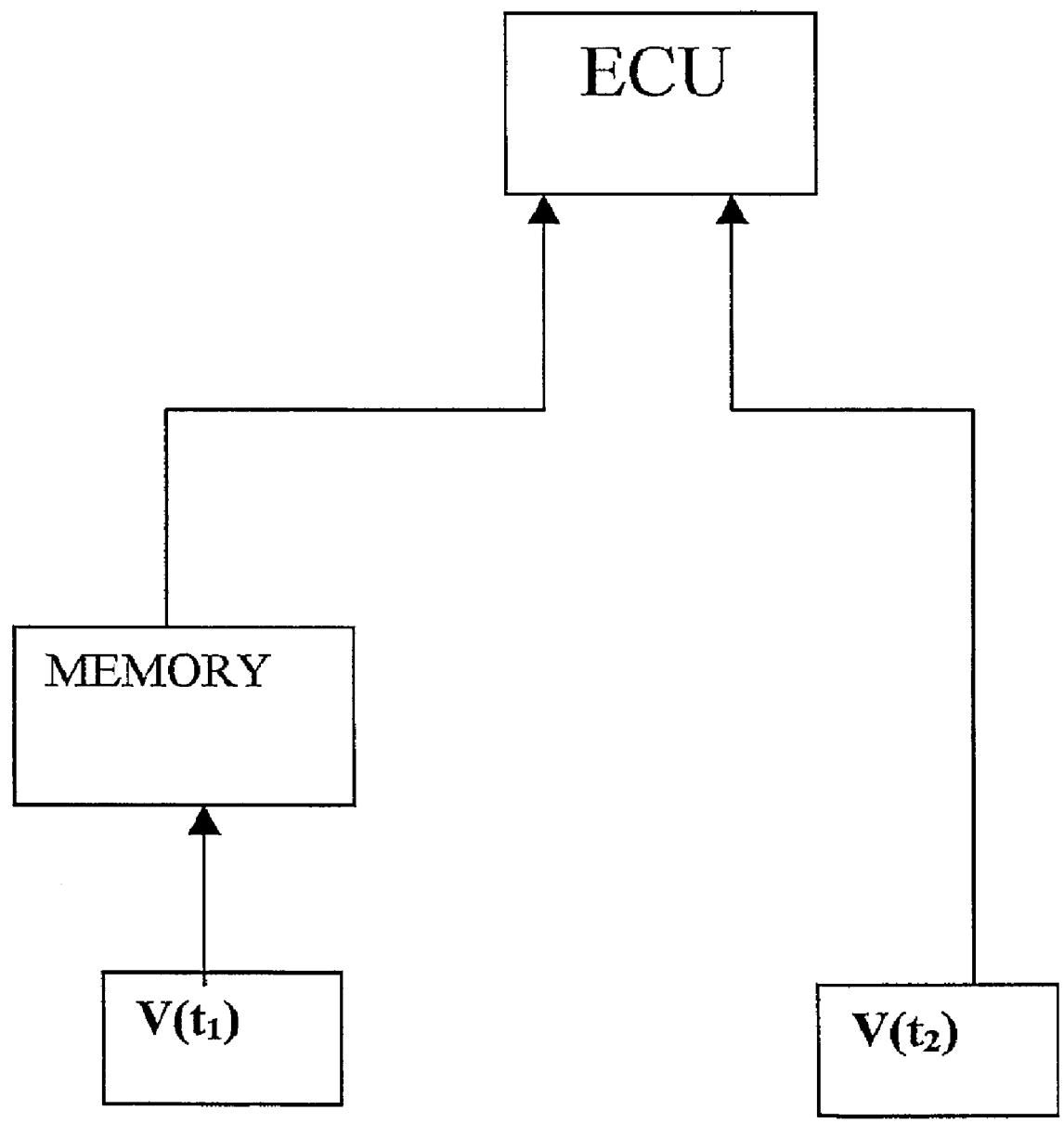
FIG. 2 shows a comparison according to the invention.

FIG. 2 shows an outline drawing of the underlying idea behind the invention. A control unit, an ECU (Electronic Control Unit), in a vehicle measures, or obtains from separate measuring equipment in the vehicle, the value V(t1) of the battery voltage in the vehicle at a first moment in time t1. This value of the battery voltage is stored and later compared with the value V(t2) of the battery voltage at a subsequent second moment in time t2. The value for the moment in time t2 is suitably the actual value of the vehicle's battery voltage at the time of the comparison, but can also be a stored value from another moment in time that differs in time from t1. If V(t2) differs from V(t1) by a certain predetermined minimum value, the ECU will assume that a short circuit has taken place. The size of this minimum difference value can, of course, vary between different types of vehicle and different models, but a suitable value for the difference is of the order of 200 mV or more for a vehicle with a system voltage of 28 Volt. The time between the two measurement values V(t1) and V(t2) that are compared with each other can, of course, also vary depending upon the application, but can suitably be of the order of 1-10 ms, which thus corresponds to the frequency at which a comparison is made. As mentioned above, the comparison can suitably be carried out continually while the vehicle is in operation.

Short circuits that are of the duration that has been mentioned, in other words of the order of fractions of a second, will scarcely be noticed by the driver, but can still constitute important information for an inboard computer, as short circuits caused by, for example, damaged insulation around cables tend to become worse with time. The inboard computer, the ECU, or some other function in the vehicle that receives information from the ECU can utilize the information concerning short circuits that are of short duration and/or intermittent to investigate whether the number of such short circuits increases. Such an increase can, in turn, be used by the inboard computer or another similar function in the vehicle to warn the driver or to recommend to the driver that troubleshooting should be carried out.

Figure 3:
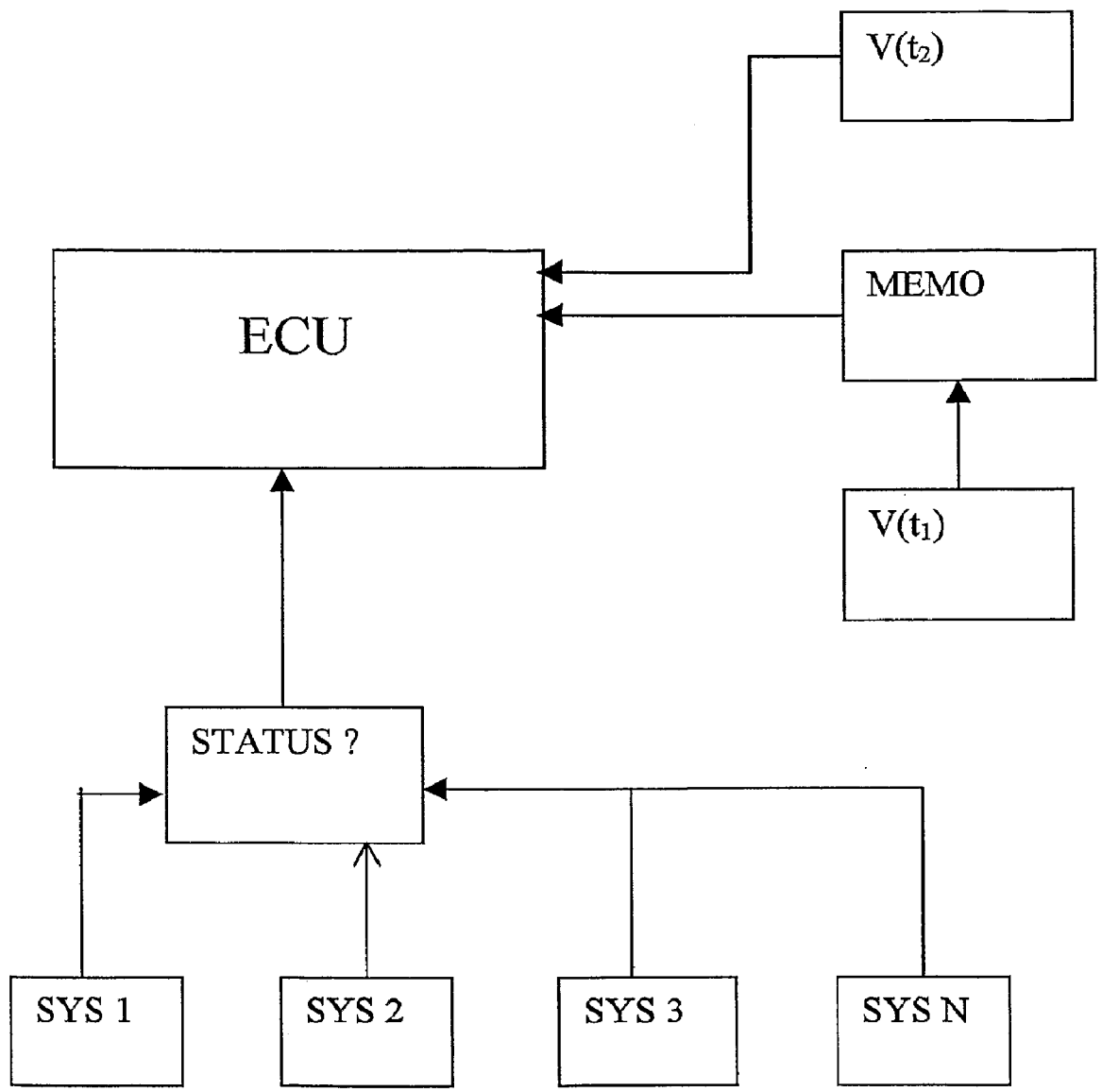
FIG. 3 shows an additional comparison according to the invention.

FIG. 3 shows a more detailed outline block diagram of an arrangement according to the invention. As with the arrangement in FIG. 2, an inboard computer, ECU, or the like in the vehicle is provided with the ability to obtain the value V(t1) of the battery voltage at a first moment in time t1, which value has been measured at the moment in time t1, and has been stored, and also to obtain the value of the battery voltage V(t2) at a subsequent second moment in time t2.

As mentioned above, the connecting in of various subsystems in the vehicle that consume electricity can cause a drop in voltage similar to the one that is caused by a short circuit. Therefore, if the ECU detects a difference between V(t1) and V(t2) concerning amplitude and extent in time that indicates a short circuit, the ECU carries out a status control of certain predefined subsystems in the vehicle. Examples of such subsystems have been given above, for example lights, audio, air-conditioning, climate-control, etc. These subsystems are such that they draw a lot of current and therefore produce a drop in voltage that resembles a temporary short circuit.

The status control that the ECU carries out is that it stores in a memory information concerning which of the predefined subsystems are connected in or disconnected. If the ECU has information to the effect that one or several of the subsystems have been engaged at a moment in time that lies between t1 and t2, it is assumed that no short circuit has taken place.

In the present application, the use of terms such as "including" is open-ended and is intended to have the same meaning as terms such as "comprising" and not preclude the presence of other structure, material, or acts. Similarly, though the use of terms such as "can" or "may" is intended to be open-ended and to reflect that structure, material, or acts are not necessary, the failure to use such terms is not intended to reflect that structure, material, or acts are essential. To the extent that structure, material, or acts are presently considered to be essential, they are identified as such.

The invention is not restricted to the embodiments described above, but can be varied freely within the framework of the attached patent claims.

What is claimed is:

1. A method for the detection of short circuits in the electrical system in a vehicle provided with a battery, comprising:

measuring and storing a value of a battery voltage at a first moment in time;

measuring and storing a value of the battery voltage at a second moment in time;

comparison of the values of the battery voltages at the first and second moments in time;

checking if the battery voltages at the first and the second moments in time differ from each other by more than a predetermined value, and checking whether at least one of certain predefined systems in the vehicle have been engaged during an interval of time between the first and the second moments in time; and generating a message indicative of a short circuit if the battery voltages at the first and second moments in time differ from each other by more than a predetermined value and if none of the certain predefined systems in the vehicle have been engaged during the time interval.

2. The method as claimed in claim 1, comprising carrying out the method continually while the vehicle is in operation.

3. An arrangement for detection of short circuits in an electrical system in a vehicle provided with a battery, comprising:

means for measuring and storing a value of the battery voltage at a first moment in time;

means for measuring the value of the battery voltage at a second moment in time;

means for comparing the values of the battery voltage at the first and second moments in time;

means arranged to check if the battery voltages at the first and the second moments in time differ from each other by more than a predetermined value, and means arranged to check whether at least one of certain predefined systems in the vehicle have been engaged during an interval of time between the first and the second moments in time; and means for generating a signal indicative of a short circuit if the battery voltages generated at the first and second moments in time differ from each other by more than the predetermined value and if none of the certain predefined systems in the vehicle have been engaged during the time interval.

4. The arrangement as claimed in claim 3, wherein an electronic control unit comprises at least one of the measuring means, the comparing means, and the signal generating means.

* * * * *